United States Patent
Obiya

(10) Patent No.: US 7,417,324 B2
(45) Date of Patent: Aug. 26, 2008

(54) SEMICONDUCTOR DEVICE AND METHOD FOR MANUFACTURING THE SAME

(75) Inventor: Tomochika Obiya, Fukuoka (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 314 days.

(21) Appl. No.: 11/075,442

(22) Filed: Mar. 9, 2005

(65) Prior Publication Data

US 2005/0200015 A1    Sep. 15, 2005

(30) Foreign Application Priority Data

Mar. 10, 2004    (JP) .............................. 2004-068191

(51) Int. Cl.
  *H01L 23/48* (2006.01)
  *H01L 23/52* (2006.01)

(52) U.S. Cl. ........................ 257/780; 257/781; 257/782; 257/784; 257/786; 257/E33.066; 257/E23.001; 257/E23.02; 257/E23.021

(58) Field of Classification Search .................. 257/734, 257/735, 737, 738, 773, 780–782, 784–786, 257/E33.062, E33.066, E23.001, E23.014, 257/E23.02, E23.021

See application file for complete search history.

(56) References Cited

U.S. PATENT DOCUMENTS

| 4,717,066 | A  | * | 1/1988  | Goldenberg et al. ...... 228/180.5 |
| 5,366,692 | A  | * | 11/1994 | Ogashiwa .................... 420/565 |
| 6,541,848 | B2 | * | 4/2003  | Kawahara et al. ........... 257/690 |
| 6,815,789 | B2 | * | 11/2004 | Tiziani et al. ............... 257/459 |

FOREIGN PATENT DOCUMENTS

| JP | 11-097476   | 4/1999 |
| JP | 2001-015677 | 1/2001 |
| JP | 2001-237263 | 8/2001 |

\* cited by examiner

*Primary Examiner*—Jasmine Clark
(74) *Attorney, Agent, or Firm*—McGinn IP Law Group, PLLC

(57) ABSTRACT

A semiconductor device is composed of a semiconductor chip, aluminum pads formed on the semiconductor chip, alloy ball bumps, which are formed on the aluminum pads, containing gold and Pd, and gold wires, which are connected to the alloy ball bumps, having a surface made of gold. The alloy ball bumps may be composition containing gold not less than 98 mass % to not more than 99.5 mass % and palladium not less than 0.5 mass % to not more than 2 mass %. The semiconductor device having above configuration is excellent in long-term reliability.

23 Claims, 10 Drawing Sheets

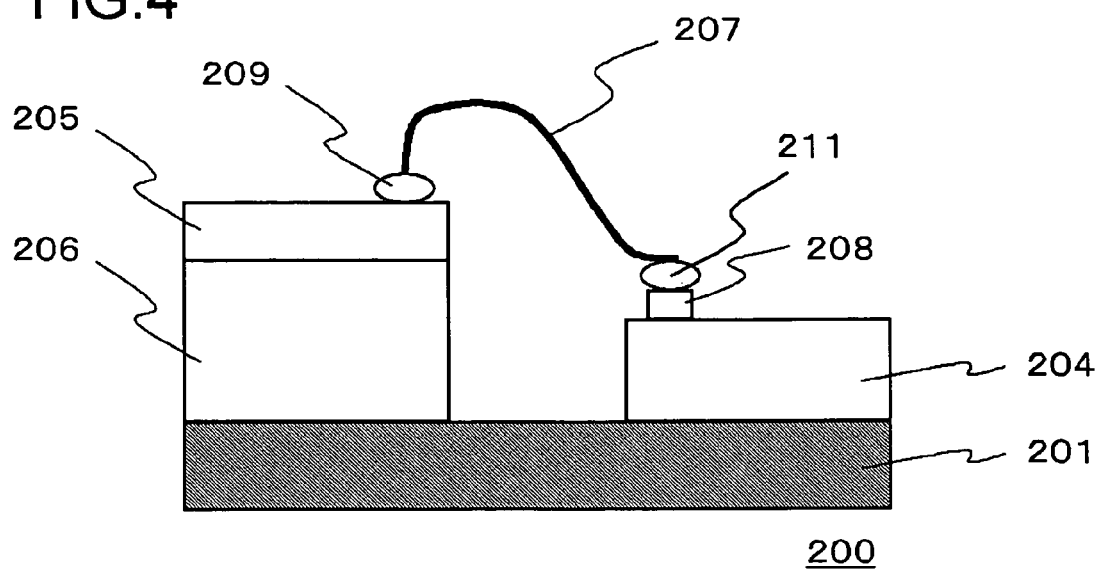
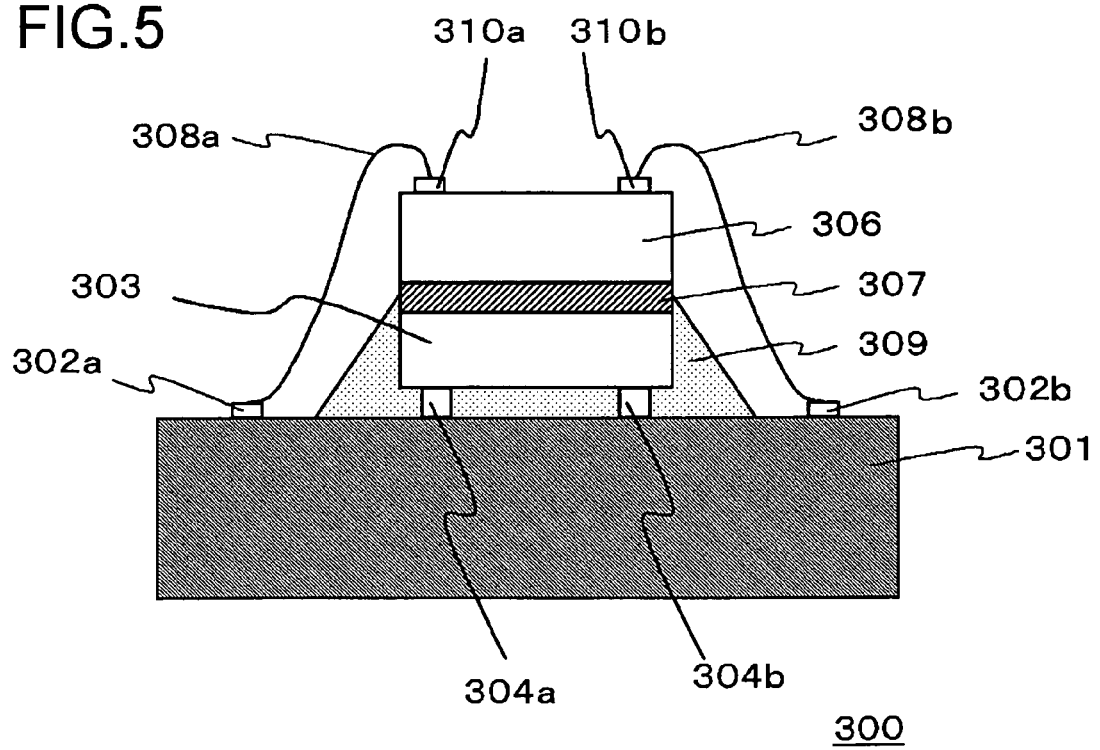

802
804

802
806

MODE: Br CORROSION

MODE: KIRKENDALL VOID

SEMICONDUCTOR DEVICE AND METHOD FOR MANUFACTURING THE SAME

This application is based on Japanese patent application NO. 2004-068191, the content of which is incorporated hereinto by reference.

BACKGROUND OF THE INVENTION

1. Field of the Invention

The present invention relates to a semiconductor device and a method for manufacturing the same.

2. Related Art

In recent years, a development of method for connecting semiconductor element by various wire bonding methods is energetically performed, with the object of realization of high reliability of semiconductor elements. As this kind of technique, there is one, which is described in the Japanese Laid-Open Patent Publication No. 2001-237263. FIG. 4 shows a semiconductor device described in the literature.

The semiconductor device (a high frequency circuit device 200) is composed of a high frequency semiconductor substrate 204 and a high frequency circuit substrate 206 on a base plate 201. A high frequency transmission line 205 is provided on the high frequency circuit substrate 206.

On the other hand, a bonding pad 208 is formed on the high frequency semiconductor substrate 204. Metal bumps 211 are formed on the bonding pad 208. A bonding wire 207 lengthened from a starting point of wire bonding 209 is connected to the metal bumps 211.

On this technique, in order to be obtained sufficient maintenance of reliability in a connecting portion, the metal bumps 211 of gold or copper are formed previously on the bonding pads 208, to which wire bonding is carried out.

Further, as this kind of technique, there is one, which is described in the Japanese Laid-Open Patent Publication No. 2001-15677. FIG. 5 shows a semiconductor device described in the literature.

This semiconductor device 300 is composed of a lower side semiconductor chip 303 and an upper side semiconductor chip 306 on an interconnect substrate 301. The lower side semiconductor chip 303 is provided in face down to be connected to the interconnect substrate 301 through gold ball bumps 304a, 304b. The semiconductor chip 306 is provided on the lower side semiconductor chip 303 through an adhesive 307 so that a main face of the semiconductor chip 306 faces upward. A side face and an underside of the semiconductor chip 303 are covered with a adhesive resin layer 309, thus the semiconductor chip 303 is fixed on the interconnect substrate 301 with the adhesive resin layer 309.

Electrode pads 310a, 310b, made of aluminum or the like are formed, on a top surface of the upper side semiconductor chip 306. Connection pads 302a, 302b made of aluminum or the like are also formed, on a top surface of the interconnect substrate 301. The electrode pads 310a, 310b are respectively connected to the connection pads 302a, 302b with bonding wires 308a, 308b.

In this technique, the above described structure is adopted, with the object to mount a plurality of semiconductor elements with high density. Further, the wire bonding is directly performed on the electrode pads 310a, 310b, and the connection pads 302a, 302b made of aluminum or the like.

Further, as this kind of technique, there is one, which is described in the Japanese Laid-Open Patent Publication No. 1999-97476. FIG. 6 shows a semiconductor device described in the literature.

The semiconductor device 400 is provided with a lead wire 405 within an insulating film 410. A semiconductor chip 401 is formed on the insulating film 410 and the lead wire 405 through an adhesive tape 406. An electrode pad 402 is formed on the semiconductor chip 401. A gold ball bump 414 on the electrode pad 402 is formed.

A bonding wire 404 lengthened from a wire bonding starting point 415 on the lead wire 405 is connected to the gold ball bump 414. All of the adhesive tape 406, the semiconductor chip 401, the electrode pad 402, the gold ball bump 414, the bonding wire 404 and the wire bonding starting point 415 are sealed with a resin sealing body 407. A solder ball 408 is formed at the reverse side of the insulating film 410.

In this technique, with the object to miniaturize the semiconductor device, after forming the gold ball bump 414 on the electrode pad 402, a reverse wire bonding is preformed from the wire bonding starting point 415 to the gold ball bump 404, while lengthening the bonding wire 404 with an angle near to perpendicularity.

SUMMARY OF THE INVENTION

However, the inventor has now discovered that the conventional technique described in the above literatures has still room for further improvement.

It has now been discovered by the inventor that, in some cases, contact property of a connecting part between the aluminum pad of the semiconductor chip and gold wire deteriorates caused by minute amount of water, when using a wire bonding of the gold wire made of pure gold having the degree of 99.99% purity to connect the semiconductor chip with the outer lead wire, in the semiconductor device sealed with the resin sealing body such as an epoxy resin described above, in particular, when using for a long term.

In the Japanese Laid-Open Patent Publication No. 2001-237263, the metal bump made of gold, copper or the like on the bonding pad made of aluminum or the like is previously formed, however, as described above, in some cases, the contact property of the connecting part between the aluminum pad and the gold bump deteriorates, when using for a long term. Further, in the case that the metal bump is the copper bump, in some cases, the contact property between the copper bump and the gold wire becomes insufficient when performing wire bonding with the gold wire.

In the Japanese Laid-Open Patent Publication No. 2001-15677, because of the configuration in which the wire bonding of the gold wire directly is carried out to the aluminum pad, as described above, in some cases, the contact property of the connecting part between the aluminum pad and the gold wire deteriorates, when using for a long term.

In the Japanese Laid-Open Patent Publication No. 1999-97476, because of the configuration in which the gold ball bump is formed on the electrode pad, in the case that the electrode pad is the aluminum pad as described above, in some cases, the contact property of the connecting portion between the aluminum pad and the gold bump deteriorates, when using for a long term.

According to the present invention, there is provided a semiconductor device comprising a semiconductor element, an electrode pad formed on the semiconductor element, a metal bump formed on the electrode pad, and containing gold and palladium, and a conductive wire connected to the metal bump, and having a surface made of gold.

According to the present invention, the metal bump contains gold and palladium, therefore, stability of contact resistance of a connecting portion between the electrode pad and the metal bump is maintained for a long term, so that the semiconductor device that is excellent in long-term reliability can be obtained.

Further, according to the present invention, there is provided a method for manufacturing a semiconductor device, comprising: forming an electrode pad on a semiconductor element, forming a metal bump containing gold and palladium on the electrode pad, and connecting a conductive wire having a surface made of gold to the metal bump.

According to the present invention, since including the forming the metal bump containing gold and palladium on the electrode pad, it is possible to form the connecting portion between the electrode pad and the metal bump, in which stability of the contact resistance is maintained for a long term, thus, it is possible to manufacture the semiconductor device that is excellent in long-term reliability.

Although, as above, there is described constitution of the present invention, combined arbitrarily by those of constitution is effective as the present invention.

For instance, the semiconductor device of the present invention may be the semiconductor device provided with independent semiconductor element, on the contrary, the semiconductor device of the present invention may be also the semiconductor device provided with a plurality of semiconductor elements. These semiconductor elements may be connected with one another, on the contrary, these semiconductor elements may not be connected with one another.

In the present invention, the metal bump may be contain gold not less than 98 mass % to not more than 99.5 mass % and Pd not less than 0.5 mass % to not more than 2 mass %.

According to this configuration, in the case of long term use, an occurrence of corrosion in the connecting part between the electrode pad and the metal bump is suppressed, owing to this, stability of contact resistance between the electrode pad and the metal pad is maintained for a long term.

Further, the electrode pad may contain aluminum.

According to this configuration, it is possible to obtain a semiconductor device provided with an electrode pad made of aluminum having excellent conductivity, excellent processability and excellent cost performance. Further, in long term use, occurrence of corrosion in the connecting portion between the electrode pad made of aluminum and the metal bump is suppressed, owing to this, stability of contact resistance between the electrode pad and the metal bump is maintained for a long term.

Further, the conductive wire may be a gold wire.

According to this configuration, since the gold wire has preferable bendability, and contact property between the gold wire and the metal bump composed of the above composition is excellent, it is possible to appropriately perform connecting between the gold wire and the metal bump by the wire bonding method. Further, also the gold wire is excellent in conductivity.

Further, the conductive wire may be a conductive wire on a TAB tape.

According to this configuration, it is possible to preferably perform connecting between the conductive wire on the TAB tape and the metal bump by the TAB bonding method or the like, because the TAB tape is excellent in its bendability, and also contact property between the conductive wire with surface of gold on the TAB tape and the metal bump composed of the above composition is excellent.

In the present invention, the above semiconductor device may be further provided with a resin sealing body sealing the semiconductor element, the electrode pad, the metal bump and the conductive wire.

According to this configuration, since intrusion of water is suppressed with the resin sealing body, the stability of contact resistance between the electrode pad and the metal bump is maintained for a long term.

In the present invention, the above semiconductor device may further comprise a lead wire, and a second metal bump formed on an end portion of the lead wire, and connected to the conductive wire, and containing gold and palladium.

According to this configuration, stability of contact resistance between the lead wire and the metal bump is maintained for a long term, because occurrence of corrosion in the connecting portion between the lead wire and the metal bump is suppressed.

Further, the end portion of the lead wire may contain aluminum.

According to this configuration, it is possible to obtain a semiconductor device provided with a lead wire composed of aluminum which has excellent conductivity, excellent processability and excellent cost performance. Further, occurrence of corrosion in the connecting portion between the end portion of the lead wire containing aluminum and the metal bump is suppressed, therefore, stability of the contact resistance between the lead wire and the metal bump is maintained for a long term.

Further, the resin sealing body may further seal the end portion of the lead wire and the second metal bump.

According to this configuration, stability of contact resistance between the end portion of the lead wire and the metal bump is maintained for a long term because intrusion of the water is suppressed with the resin sealing body.

According to the present invention, the semiconductor device is obtained, which is excellent in long-term reliability because there is provided the metal bump comprised of specific composition.

BRIEF DESCRIPTION OF THE DRAWINGS

The above and other objects, advantages and features of the present invention will be more apparent from the following description taken in conjunction with the accompanying drawings, in which:

FIG. 4 is a sectional view schematically showing the conventional semiconductor device;

FIG. 5 is a sectional view schematically showing the conventional semiconductor device;

DETAILED DESCRIPTION OF THE INVENTION

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Hereinafter, there will be described an embodiment of the present invention with reference to accompanied drawings. It should be noted that in the whole drawings, the same mark is added to the same structural element to omit explanation appropriately.

FIRST EMBODIMENT

Figure 1:
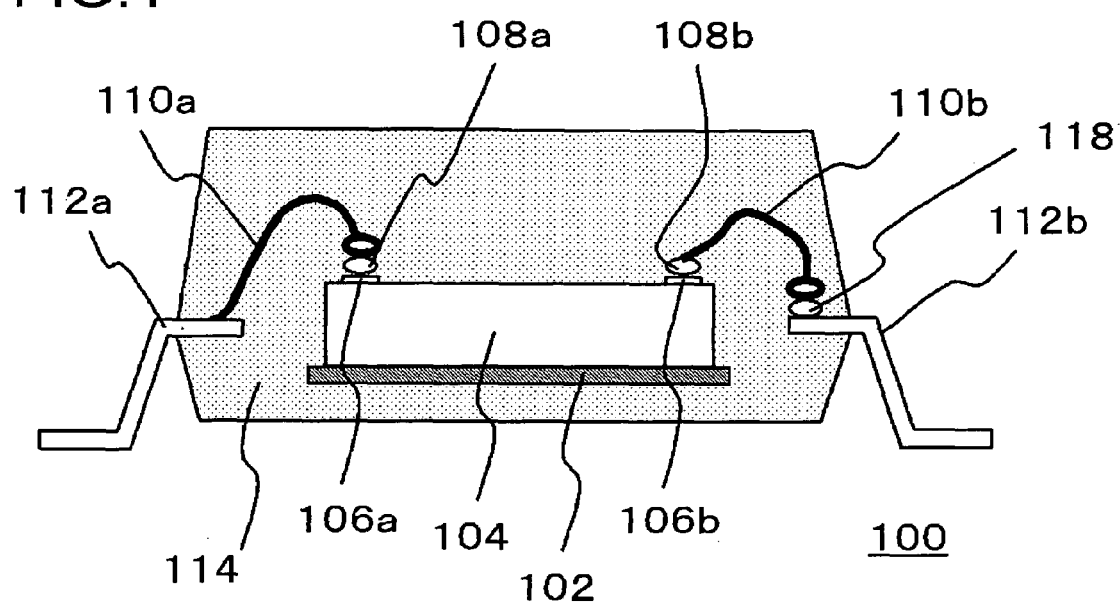
FIG. 1 is a sectional view schematically showing a semiconductor device according to an embodiment.

FIG. 1 is a sectional view schematically showing a semiconductor device according to the present embodiment.

A semiconductor device 100 is provided with a semiconductor chip 104 adhered on the island 102 by an adhesive. Aluminum pads 106a, 106b for wire bonding are formed on an upper face of the semiconductor chip 104. Respective alloy ball bumps 108a, 108b are formed on the aluminum pads 106a, 106b.

Lead wires 112a, 112b are formed on both sides of the semiconductor chip 104 with some distance from the semiconductor chip 104. An alloy ball bump 118 is formed on an end portion of the lead wire 112b. The alloy ball bump 118 is connected to the alloy ball bump 108b with a high purity gold wire 110b. The end portion of the lead wire 112a is connected to the alloy ball bump 108a with a high purity gold wire 110a.

The above described island 102, the semiconductor chip 104, the aluminum pads 106a, 106b, the alloy ball bumps 108a, 108b, 118, the high purity gold wires 110a, 110b, and end portion of the lead wires 112a, 112b are sealed with a resin sealing body 114.

The alloy ball bumps 108a, 108b, 118 used for the semiconductor device 100 are formed upon using, for instance, a gold wire of mixed molten gold wire of high purity gold having not less than 99.99% purity and Pd. For this reason, there is an advantage that stability of contact resistance of the connecting portion between the aluminum pads 106a, 106b and the alloy ball bumps 108a, 108b is maintained. It should be noted that the alloy ball bumps 108a, 108b may contain not less than one kind of metals in minute amounts selected from a group composed of Ag, Cu, Fe, Mg, Be and Ca.

Hereinafter, there will be described effect in accordance with constitution of the present embodiment.

The high purity gold wires 110a, 110b, are connected to the alloy ball bumps 108a, 108b in the semiconductor device 100. The high purity gold wires 110a, 110b, are excellent in bendability. Further, the high purity gold wires 110a, 110b, and the alloy ball bumps 108a, 108b comprised of the above composition are excellent in contact property. For this reason, the high purity gold wires 110a, 110b, are easily connected to the alloy ball bumps 108a, 108b with wire bonding having excellent contact property. Consequently, the semiconductor device 100 has advantage that a configuration is excellent in contact property and manufacturing stability.

On the other hand, in the conventional semiconductor device, in the case where since the aluminum pad of the semiconductor chip is connected to the gold wire directly, therefore, when using a long term, in some cases, contact property of the connecting portion between the aluminum pad and the gold wire deteriorates caused by a slight amount of water.

Figure 8A:
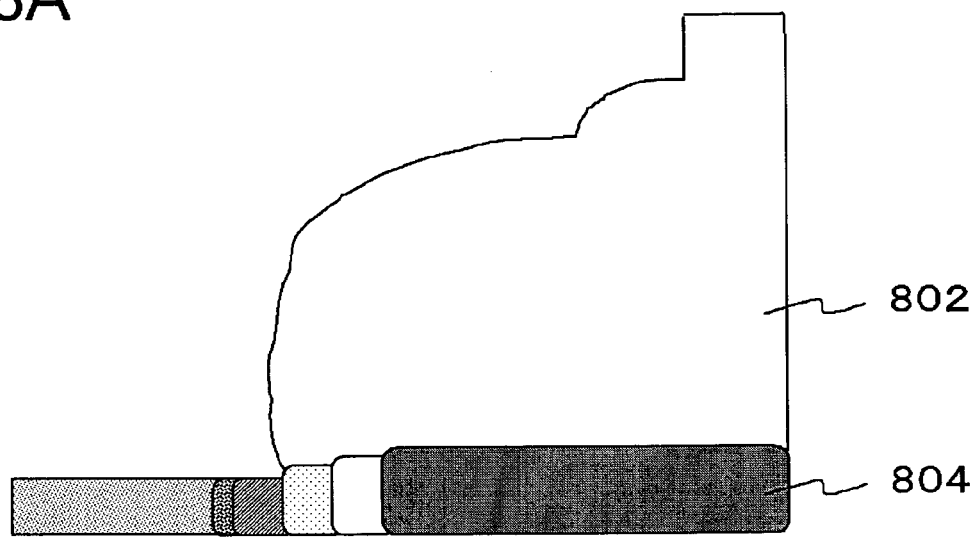
FIGS. 8A and 8B are sectional views schematically illustrating about contact property of a connecting portion between an aluminum pad and a gold wire in the conventional semiconductor device.
Figure 8B:
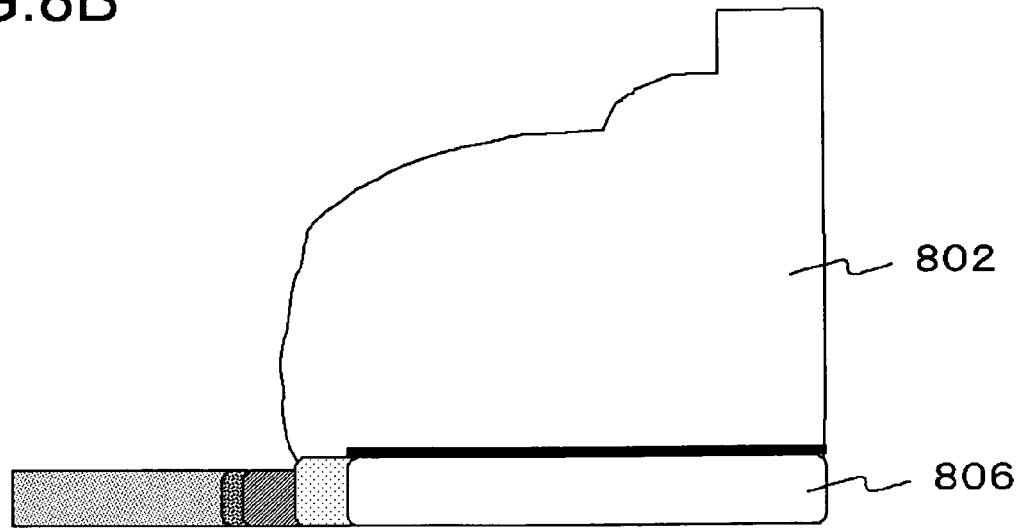

FIGS. 8A and 8B are schematic sectional views for illustrating the semiconductor device provided with configuration of connecting the aluminum pad and the gold wire directly.

FIG. 8A is a schematic sectional view showing a mechanism deterioration of contact property of the connecting portion between the aluminum pad and the gold wire caused by Br corrosion mode. Thus, in the case where Br is contained within a resin around the connecting portion between the aluminum pad and the gold wire, Br within the resin becomes a catalyst, an alloy layer within the aluminum pad, which comes into contact with a bonding ball 802 is oxidized, so that, in some cases, the alloy layer within the aluminum pad becomes a corrosion layer 804.

Specifically, it is conceivable that chemical reaction represented by following two formulas takes place.

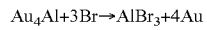

$$Au_4Al + 3Br \rightarrow AlBr_3 + 4Au$$

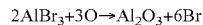

$$2AlBr_3 + 3O \rightarrow Al_2O_3 + 6Br$$

Thus, finally, alumina is inevitably generated on a surface of the aluminum pad.

FIG. 8B is a sectional view schematically showing a mechanism of contact property deterioration of the connecting portion between the aluminum pad and the gold wire depending on Kirkendall void mode. Thus, voids take place around the connecting portion caused by difference of diffusion coefficient between Au and Al in the connecting portion between the bonding ball 802 and the aluminum pad, in some cases, resulting in a Kirkendall void layer 806.

Figure 9A:
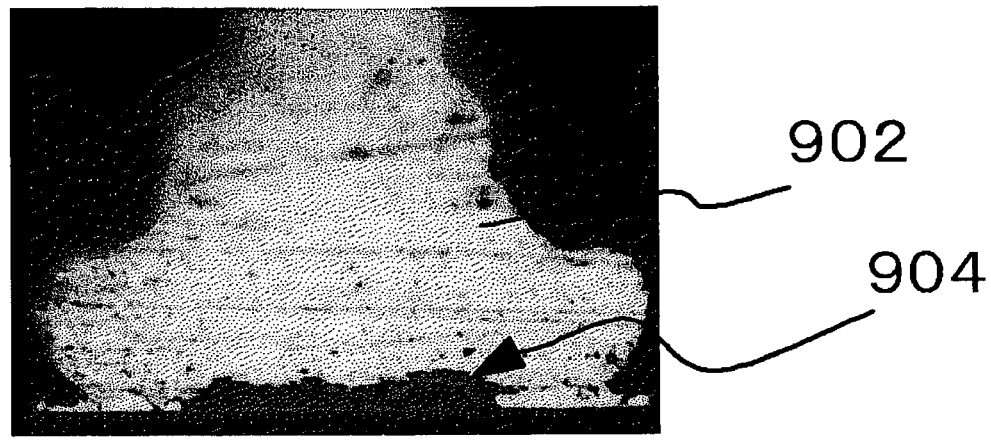
FIGS. 9A and 9B are sectional views explaining about contact property of the connecting portion between an aluminum pad and a gold wire in the conventional semiconductor device.
Figure 9B:
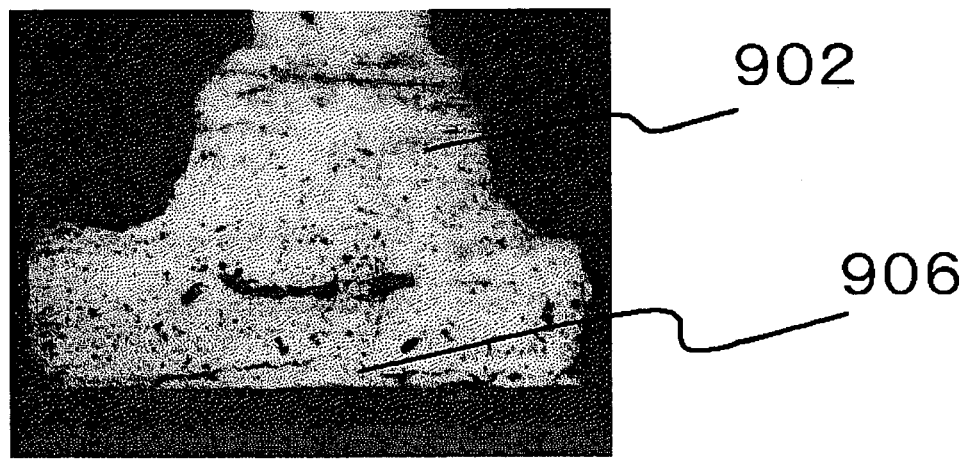

FIGS. 9A and 9B are sectional views for describing about the contact property of the connecting portion between the aluminum pad and the gold wire in the conventional semiconductor device.

FIG. 9A is a sectional view showing a mechanism of contact property deterioration of the connecting portion between the aluminum pad and the gold wire caused by Br corrosion mode. Thus, an alloy layer within the aluminum pad coming into contact with the bonding ball 902 is oxidized, in some cases, resulting in a corrosion layer 904.

FIG. 9B is a sectional view showing a mechanism of contact property deterioration of the connecting portion between the aluminum pad and the gold wire caused by the Kirkendall void mode. Thus, voids take place around the connecting portion caused by a difference of the diffusion coefficient between Au and Al in the connecting portion between the bonding ball 902 and the aluminum pad, in some cases, resulting in a Kirkendall void layer 906.

On the contrary, in the semiconductor device of the present embodiment, the alloy ball bump containing gold and Pd is formed between the bonding ball of the gold wire and the aluminum pad, owing to this, stability of a contact resistance of the connecting portion between the aluminum pad and the alloy ball bump is maintained for a long term. Further, the contact property between the bonding ball of the gold wire and the alloy ball bump containing gold and Pd is good.

Owing to this, according to this configuration, a semiconductor device having long-term reliability is obtained.

It is conceivable that, in the case where the alloy ball bump containing gold and Pd is formed between the bonding ball of the gold wire and the aluminum pad, the stability of the contact resistance of the connecting portion between the aluminum pad and the alloy ball bump is maintained based on the following mechanism for a long term.

Figure 10:
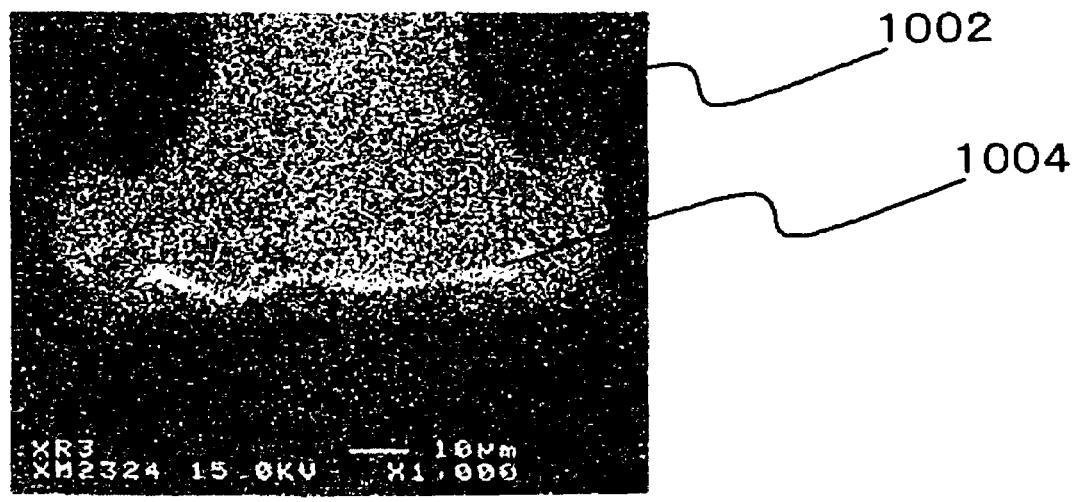
FIG. 10 is a sectional view as being reference explaining mechanism for which stability of contact resistance at the connecting portion between an electrode pad and a metal bump is maintained for a long term in the embodiment.

FIG. 10 is a sectional view as being reference for illustrating a mechanism by which the stability of the contact resistance of the connecting portion between the aluminum pad and the alloy ball bump is maintained for a long term in the present embodiment.

In FIG. 10, the enlarged connecting portion between the bonding ball 1002 of the alloy wire and the aluminum pad is shown, in the case where the alloy wire containing gold and Pd is made to connect through the wire bonding to the aluminum pad. The more Pd element concentration is high, the more it is indicated with white, so that it is found that a Pd rich layer 1004 is formed along the connecting portion between the bonding ball 1002 and the aluminum pad.

Generally, when Au and Al are diffusing, in the alloy layer between Au and Al, absolute quantity of Al is small, resulting in an Au rich layer. However, in the present embodiment, the Pd rich layer 1004 is formed in the vicinity of the interface between the bonding ball 1002 and the aluminum pad because Pd is contained in the alloy wire. This Pd rich layer 1004 suppresses that the alloy layer of Au and Al becomes the Au rich layer, upon suppressing diffusion of Au from the bonding ball 1002 over the Pd rich layer 1004. Because Pd has characteristic, which is difficult to be diffused in Au. For this reason, a void occurrence is suppressed in the connecting portion between the bonding ball 1002 and the aluminum pad.

Further, when the semiconductor device 100 is provided with the resin sealing body 114, corrosion is further suppressed in the connecting portion between the alloy ball bumps 108a, 108b and the aluminum pads 106a, 106b, so that the stability of the contact resistance is maintained for a further long term.

Further, in the semiconductor device 100, thus, the alloy ball bump 118 is formed in such a way as to use the mixed molten alloy wire of high purity gold having not less than 99.99% purity and Pd, therefore, the stability of the contact resistance of the connecting portion between the lead wire 112b and the alloy ball bump 118 is maintained for a long term. The alloy ball bump 118 may include not less than one kind of metal selected from a group composed of Ag, Cu, Fe, Mg, Be and Ca other than the above.

Further, the stability of the contact resistance of the connecting portion between the end portion of the lead wire 112b made of aluminum and the alloy ball bump 118 is similarly maintained for a long term.

In this portion too, the high purity gold wire 110b is connected to the alloy ball bump 118. The high purity gold wires 110a, 110b, are excellent in bendability. Further, the high purity gold wires 110a, 110b, and the alloy ball bump 118 composed of the above composition are excellent in contact property. For this reason, the high purity gold wires 110a, 110b, can easily be connected to the alloy ball bump 118 through the wire bonding with excellent contact property. Owing to this, the semiconductor device 100 according to the present embodiment, in case of providing such configuration, has advantage of being more excellent in long-term reliability.

Here, the composition of the gold wire, the gold ball, or the gold plating or the like which is made material of the alloy ball bumps 108a, 108b and 118, which are formed on the aluminum pads 106a, 106b and the end portion of the lead wire 112b is not limited particularly, however, such composition may contain gold not less than 98 mass % to not more than 99.5 mass %, and Pd not less than 0.5 mass % to not more than 2 mass %.

Further, it can be a composition in which silver is contained not more than 30 ppm, copper is contained not more than 20 ppm, iron is contained not more than 10 ppm, magnesium is contained not more than 20 ppm, beryllium is contained not more than 20 ppm, and calcium is contained not more than 40 ppm.

In this case, it is possible to form the alloy ball bumps 108a, 108b, and 118 with the gold wire, the gold ball or the gold plating while using the gold wire composed of such composition.

In the case of such a composition, corrosion in the connecting portion between the alloy ball bumps 108a, 108b and the aluminum pads 106a, 106b, and in the connecting portion between the alloy ball bump 118 and the high purity gold wire 110b, is effectively suppressed, so that the stability of the contact resistance is maintained for a further long term.

Further, if the composition is one described above, it is also excellent in conductivity and bendability. Further, the contact property described later gold wire therebetween becomes excellent. Consequently, it is possible to form the alloy ball bumps 108a, 108b and 118 that are excellent in balance of the conductivity, bendability and long-term reliability.

Further, in the semiconductor device 100, the wire bonding is performed to the alloy ball bumps 108a, 108b and 118 formed on the aluminum pads 106a, 106b and the lead wire 112b with the high purity gold wire 110a, 110b, having the degree of 99.99% purity.

When using the gold wire with such a composition, it is possible to obtain the effect of being excellent in bendability in case of the wire bonding or the like, and further it is possible to obtain the effect of being excellent in contact property with the alloy ball bumps 108a, 108b therebetween. Further, the gold wire with such a composition is excellent in conductivity.

On the other hand, in order to suppress the contact property deterioration of the connecting portion with the above aluminum pads 106a, 106b therebetween, it is possible to use the mixed molten gold wire of the high purity gold wire 110 and metal such as palladium, silver or copper or the like to be not more than 2%. However, in this case, the mixed molten gold wire of the high purity gold wire and a little amount of different metal other than gold increases in hardness of the gold wire, thus, in some cases, a desired shape of the gold wire can not be obtained.

Figure 11:
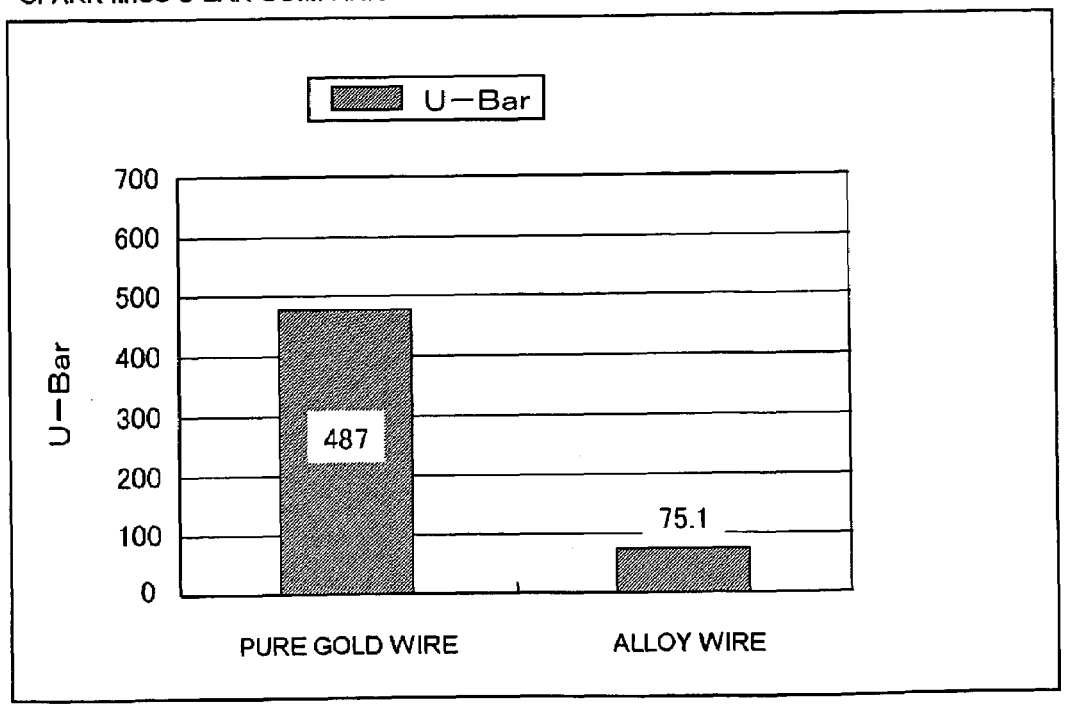
FIG. 11 is a graphical representation showing a result of comparison of wire bonding workability according to conductive wire with different material.

FIG. 11 is a graphical representation showing a result under comparison of workability of the wire bonding based on a conductive wire of different material.

As shown in FIG. 11, a U-bar value of the case where the wire bonding using the pure gold wire is connected to the aluminum pad directly, is higher than that of the alloy wire containing gold and Pd. Thus, in some cases, the alloy wire is hard and brittle in comparison with the pure gold wire, so that, in some cases, workability of the wire bonding within the assembly process of the semiconductor device deteriorates in comparison with that of the pure gold wire.

The U-bar means the number of works capable of being performed during a period of time from a short time interruption (which means defect occurrence, it is therefore necessary to stop the manufacturing line temporarily) up to the next short time interruption of the wire bonding process in the manufacturing line of the semiconductor device.

For instance, it is assumed that works are performed 2000 times per one hour, when the short time interruption occurs three times at one hour, the U-bar value becomes 2000/3, which nearly equals 667. Generally, the higher value of the U-bar is more preferable of workability, resulting in preferred one.

On the contrary, the semiconductor device 100 according to the present embodiment, the high purity gold wire 110a, 110b, are used, therefore, it is possible to easily form the connecting portion that is excellent in contact property on the alloy ball bumps 108a, 108b with the wire bonding, thus, the semiconductor device 100 has configuration that is excellent in contact property and bendability. Further, there are provided the alloy ball bumps 108a, 108b, therefore, the corrosion is suppressed in the connecting portion with the aluminum pads 106a, 106b therebetween, so that the stability of the contact resistance is maintained for a long term.

For this reason, the semiconductor device 100 is provided with configuration that is excellent in the contact property, the conductivity, the manufacturing stability and the long-term reliability and the like suitable for the wire bonding or the like.

That is, according to the semiconductor device of the present embodiment, it is possible to provide a semiconductor device that is excellent in balance of the manufacturing stability on the occasion of the wire bonding and long-term reliability that is difficult to realize in the conventional way, by combinational structure of two elements composed of the alloy ball bump containing gold and Pd, and the high purity gold wire, even though the electrode pad is the aluminum pad.

Further, it may be to use a conductive wire formed in such a way as to apply high purity gold plating or the like to a fine wire made of thin ribbon shaped resin or the like other than the high purity gold wires 110a, 110b.

Further, it may be to use a TAB tape made of a resin tape provided with a conductive wire made of high purity gold other than the high purity gold wires 110a, 110b. The TAB tape is excellent in bendability, therefore, it is possible to use for a preferable TAB bonding. When the surface of the conductive wire on the TAB tape is covered with the high purity gold plating or the like, it is excellent in conductivity and excellent in contact property with the alloy ball bumps 108a, 108b and 118 therebetween.

It should be noted that TAB, which is abbreviation of Tape Automated Bonding, means thin type mounting method of IC and LSI while using heat resistant film as a base substrate.

A pure aluminum material may be employed in the aluminum pads 106a, 106b and the lead wire 112b used in the present embodiment as material, and an alloy or the like between aluminum and the other metal as material may be employed in the aluminum pads 106a, 106b and the lead wire 112b used in the present embodiment.

Here, in the conventional semiconductor device, in the connecting portion between the aluminum pad and the gold wire, usually, in some cases, corrosion occurs caused by intrusion of a little amount of water.

However, in the semiconductor device 100 of the present embodiment, vicinity of the aluminum pads 106a, 106b is connected with the alloy ball bumps 108a, 108b of specified composition, and the wire bonding is performed with the high purity gold wires 110a, 110b on its connecting portion. For this reason, it is possible to secure a distance between the high purity gold wire 110a and the aluminum pad 106a and between the high purity gold wire 110b and the aluminum pad 106b, owing to this, it is possible to avoid corrosion of the connecting portion.

In the case where the lead wire 112b is made of metal of aluminum containing metal, it is possible to similarly suppress corrosion of the connecting portion, when forming the alloy ball bump 118 on an end portion of the lead wire 112b by using gold wire or the like containing different metal element. The same effect is obtained when alloy plating composed of the same composition as the alloy ball bump 118 is applied to the end portion of the lead wire 112b in stead of forming the alloy ball bump 118.

As the lead wire 112a, it may be to adopt connecting directly the high purity gold wire 110a without forming the alloy ball bump, however in respect of the contact property, as the lead wire 112b, to provide the alloy ball bump 118 is effective.

At this time, the wire bonding may be performed with a normal bonding in which wire bonding starts from the semiconductor chip 104 side and proceeds toward the lead wire 112a side or the lead wire 112b side. On the contrary, the wire bonding may be performed with a reverse bonding in which wire bonding starts from the lead wire 112a side or the lead wire 112b side and proceeds toward the semiconductor chip 104 side.

Further, at the lead wire 112a and the lead wire 112b side, instead of the lead wires made of pure aluminum, the lead wires 112a, 112b composed of a structure of QFP and the like using metal such as iron containing alloy, copper containing alloy, or aluminum containing alloy or the like may be to be provided. Also, in this case, the semiconductor device 100 can operate as a molded semiconductor device that is excellent in reliability.

At the lead wire 112a side and the lead wire 112b side, instead of the leads made of pure aluminum, it may be to be provided lead wires 112a, 112b in which metal wiring such as copper, nickel, aluminum, gold, titanium or the like is applied to a ceramic substrate or a glass epoxy substrate to be taken to as lead wires. Also, in this case, the semiconductor device 100, when the whole of the semiconductor device 100 is performed resin sealing, can operate as the molded semiconductor device of a BGA type that is excellent in reliability.

Further, the semiconductor device 100 is provided with the resin sealing body 114, therefore, corrosion in the connecting portion between the alloy ball bump 118 and the high purity gold wire 110b in addition to the connecting portion between the alloy ball bump 108a and the aluminum pad 106a and between the alloy ball bump 108b and the aluminum pad 106b is similarly suppressed, so that the stability of the contact resistance becomes further excellent.

The resin sealing body 114 for sealing the semiconductor device 100 of the present embodiment can adopt arbitrary resin sealing body comprising a resin or a resin composition having an electrical insulation. For instance, the resin sealing body 114 is suitable to be a type in which sealing resin is made to be an organic material such as an epoxy resin or the like. Such resin sealing body 114 composed of the organic material of the epoxy resin or the like is excellent in electrical insulation, bendability and moisture resistance, therefore, it is possible to realize the semiconductor device 100 that is excellent in reliability.

SECOND EMBODIMENT

FIGS. 2A, 2B and FIGS. 3C, 3D are process sectional views showing a method for manufacturing a semiconductor device according to the present embodiment.

Figure 2A:
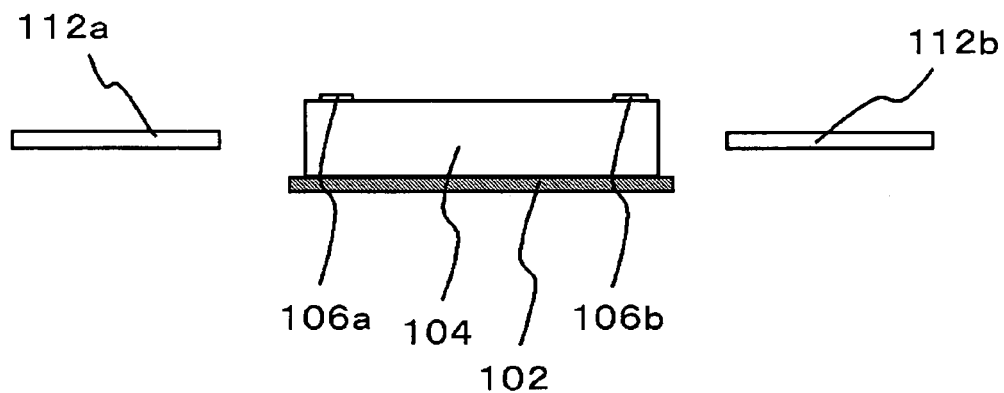
FIGS. 2A and 2B are process sectional views showing a method for manufacturing the semiconductor device according to the embodiment.

FIG. 2A is a sectional view showing mounting and connecting of a chip to a lead frame. In order to manufacture the semiconductor device 100 according to the first embodiment, as shown in FIG. 2A, a semiconductor chip 104 is provided on an island 102. The island 102 and the semiconductor chip 104 are bonded by an adhesive. Aluminum pads 106a, 106b are formed on a top face of the semiconductor chip 104. Further, lead wires 112a, 112b made of aluminum are provided while keeping a distance from the semiconductor chip 104.

Figure 2B:
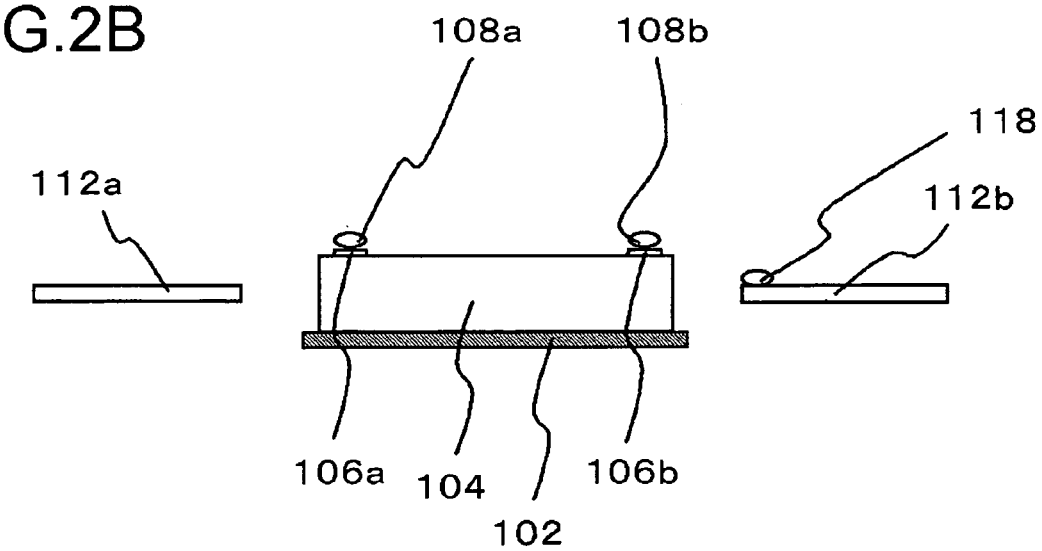

FIG. 2B is a sectional view showing a state where an alloy is made to connect at high temperature condition while forming a ball by a wire bonder. As shown in FIG. 2B, alloy ball bumps 108a, 108b and an alloy bump 118 are formed with alloy wire having specific composition constitution on the aluminum pads 106a, 106b and on the lead wire 112b while using the wire bonder or a wafer bonder. It should be noted that the specific composition constitution means a composition constitution including an alloy formed in such a way as to add not less than one kind of metal selected from a group composed of Pd, Ag, Cu, Fe, Mg, Be and Ca to the high purity gold.

The alloy ball bumps 108a, 108b and the alloy ball bump 118 may be made to form with a gold plating technique. It may be not to form the alloy ball bump 118 at the end portion of the lead wire 112b. Further, it may be to form an alloy ball bump at the end portion of the lead wire 112a.

Figure 3C:
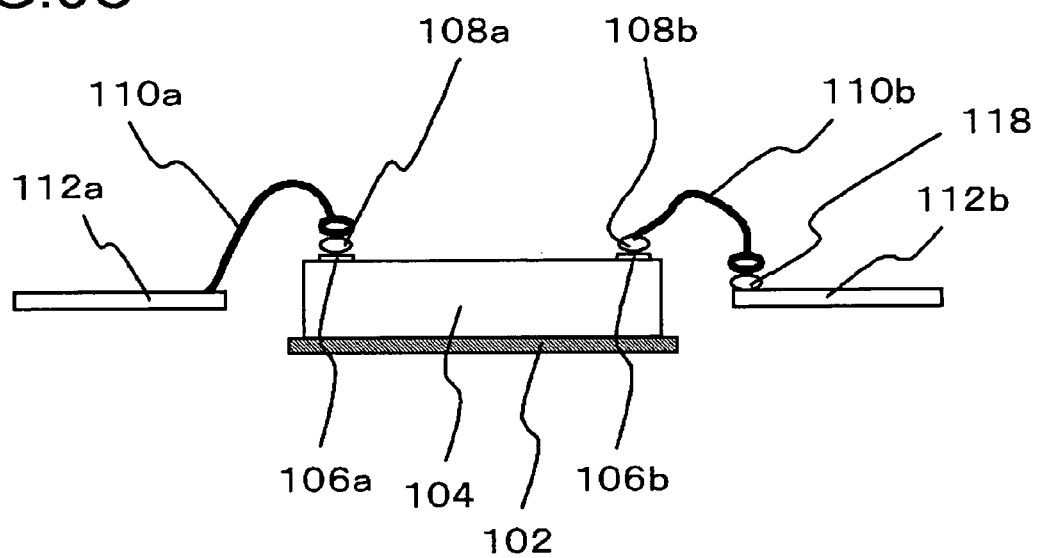
FIGS. 3C and 3D are process sectional views showing the method for manufacturing the semiconductor device according to the embodiment.

FIG. 3C is a view showing the high purity gold wire formed by the wire bonder. As shown in FIG. 3C, a wiring is performed toward the end portion of the lead wire 112a from the alloy ball bump 108a on the semiconductor chip 104 and toward the alloy ball bump 118 provided at the end portion of the lead wire 112b from the alloy ball bump 108b on the semiconductor chip 104 by the wire bonder while using the high purity gold wires 110a, 110b.

At this time, for instance, in the left side of the FIG. 3C, lead wire 112a, the wire bonding is performed by using the high purity gold wire 110a toward the lead wire 112a side from the semiconductor chip 104 side, in the case where the alloy ball bump 108a is formed only on the aluminum pad 106a.

Or, the wiring is performed by the method of reverse bonding toward the alloy ball bumps 108a on the semiconductor chip 104 from the lead wire 112a side and toward the alloy ball bump 108b on the semiconductor chip 104 from the lead wire 112b side.

Figure 3D:
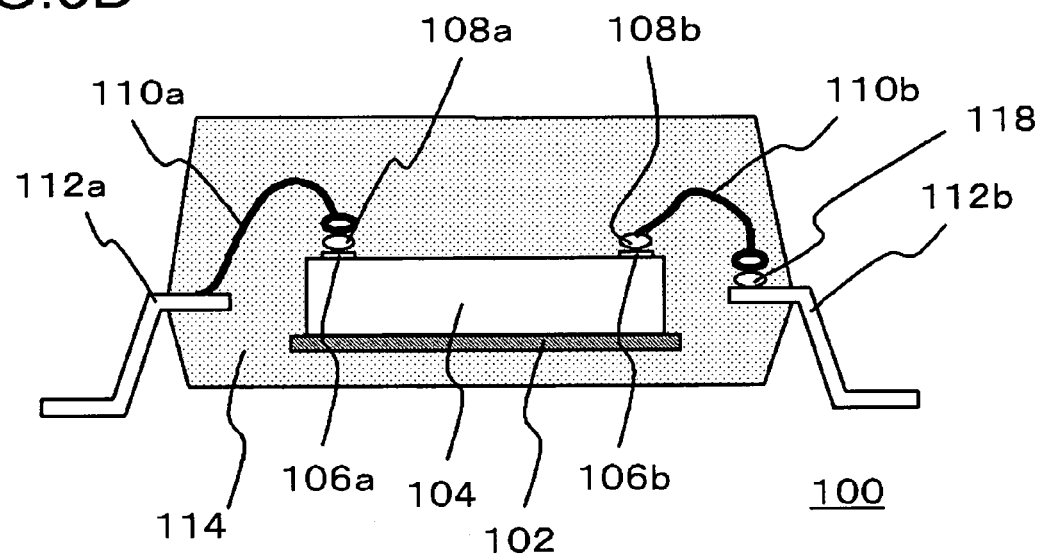
Figure 6:
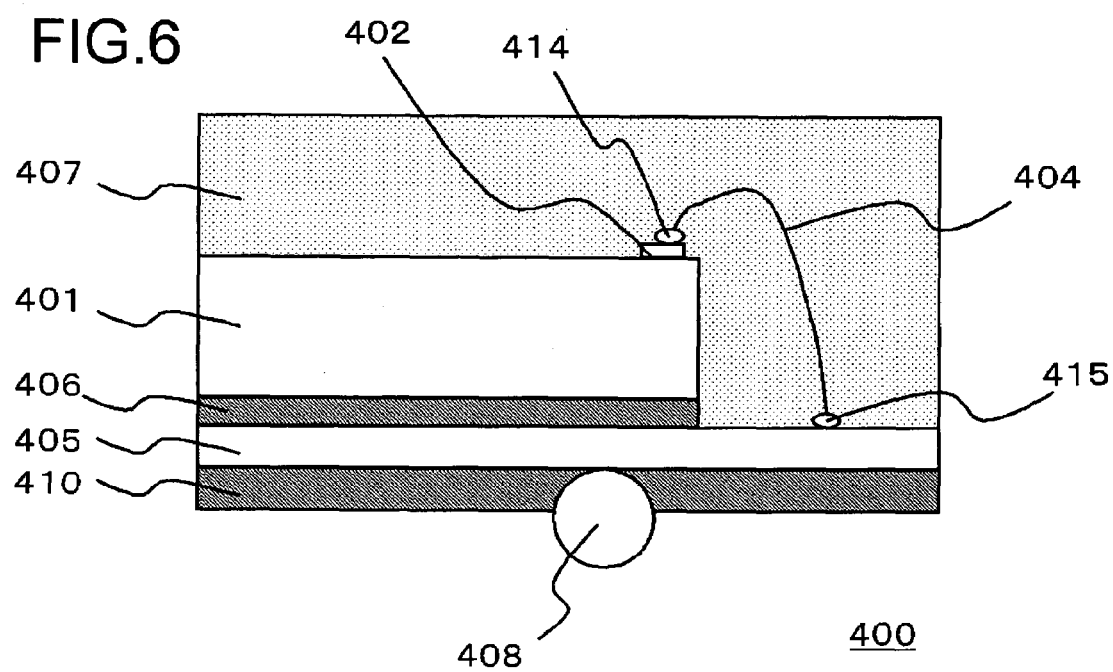
FIG. 6 is a sectional view schematically showing the conventional semiconductor device.

FIG. 3D is a sectional view showing a configuration in which the whole of the semiconductor device 100 is resin-sealed, and the lead wire is formed in the predetermined shape. As shown in FIG. 3D, the whole of the semiconductor device 100 is subjected to resin sealing by the resin sealing body 114 except for outer side end portion of the lead wires 112a, 112b of the FIG. 3C. Further, the outer side end portion of the lead wires 112a, 112b are formed in the predetermined shape.

According to the method, a process is included, which provides the alloy ball bumps 108a, 108b including an alloy formed in such a way as to add not less than one kind of metal selected from a group containing Pd, Ag, Cu, Fe, Mg, Be and Ca to the high purity gold, on a top face of the aluminum pads 106a, 106b. Therefore, it is possible to form the connecting portion between the aluminum pad 106a and the alloy ball bump 108b and between the aluminum pad 106b and the alloy ball bumps 108b in which contact property deterioration in long term use is suppressed. Thus, it is possible to manufacture the semiconductor device 100 that is excellent in long-term reliability.

Further, there is provided constitution provided with the alloy ball bump 118, which includes the alloy formed in such a way as to add not less than one kind of metal selected from a group containing Pd, Ag, Cu, Fe, Mg, Be and Ca to the high purity gold, in the end portion of the lead wire 112b, resulting in the connecting portion between the lead wire 112b and the alloy ball bump 118 where deterioration of the contact property in long term use is suppressed. Thus, the semiconductor device 100 that is excellent in long-term reliability is obtained.

Further, since the wire bonding is performed using the high purity gold wires 110a, 110b that are excellent in bendability, it is possible to easily perform the wire bonding that is excellent in contact property between the alloy ball bump 108a and the high purity gold wires 110a and between the alloy ball bump 108b and the high purity gold wire 110b.

Concerning the left side of the semiconductor device 100 in the FIG. 3D, where the alloy ball bump 108a is formed on the aluminum pad 106a, while no alloy ball bump is formed at the lead wire 112a, and the reverse bonding is performed from the lead wire 112a side toward the semiconductor chip 104 side with the high purity gold wire 110a.

Concerning the right side of the semiconductor device 100 in the FIG. 3D, where the alloy ball bump 108b is formed on the aluminum pad 106b and the alloy ball bump 118 is formed on the lead wire 112b, and the reverse bonding is performed from the lead wire 112b side toward the semiconductor chip 104 side with the high purity gold wire 110b.

At this time, with the same semiconductor chip 104, it may be to perform the bonding on both sides so as to become the same constitution as that of the left side of the above semiconductor device 100 in the FIG. 3D, and also it may be to perform the bonding on both sides so as to become the same constitution as that of the right side of the above semiconductor device 100 in the FIG. 3D. Further, it may be adopt constitution while combining the constitution of the left side of the above semiconductor device 100 in the FIG. 3D with the constitution of the right side of the above semiconductor device 100 in the FIG. 3D.

Further, the resin sealing body 114 seals the whole of the semiconductor device 100 except for the outer side end portion of the lead wires 112a, 112b, therefore, it is possible to effectively suppress intrusion of the moisture. For this reason, in long term use, deterioration of the contact property between the aluminum pad 106a and the alloy ball bump 108a and between the aluminum pad 106b and the alloy ball bump 108b are suppressed, thus it is possible to manufacture the semiconductor device 100 with high reliability. Further, deterioration of the contact property between the lead wire 112b and the alloy ball bump 118 is suppressed, so that the semiconductor device 100 with high reliability is obtained.

THIRD EMBODIMENT

Figure 7:
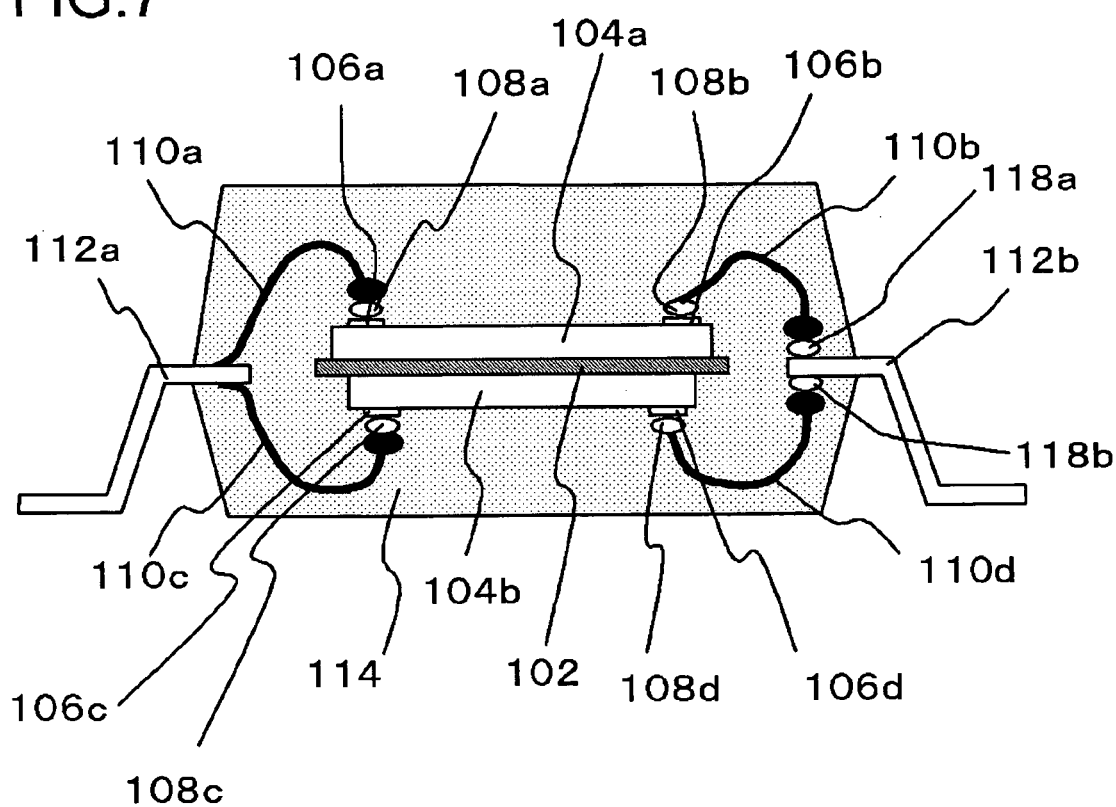
FIG. 7 is a sectional view schematically showing a semiconductor device according to a modified example of the embodiment.

FIG. 7 is a sectional view schematically showing a semiconductor device according to a modified example of the first embodiment.

A semiconductor device 500 according to the present embodiment, basically, has the same configuration as that of the semiconductor device 100 according to the first embodiment, however it is different from the first embodiment in that a plurality of semiconductor chips 104a, 104b are provided therefor.

There is provided respective semiconductor chips 104a, 104b on a top face and an under face of the island 102 in the semiconductor device 500. These semiconductor chips 104a, 104b are bonded by, for instance, an adhesive or the like to the top face and the under face of the island 102.

The aluminum pads 106a, 106b are provided on the top face of the semiconductor chip 104a. The respective alloy ball bumps 108a, 108b are formed on the aluminum pads 106a, 106b.

On the other hand, the aluminum pads 106c, 106d are provided on the under face of the semiconductor chip 104b. The respective alloy ball bumps 108c, 108d are formed under the aluminum pads 106c, 106d.

The lead wires 112a, 112b made of aluminum or the like is provided with a distance from the semiconductor chips 104a, 104b. The respective alloy ball bumps 118a, 118b may be formed on the top face and the under face of the end portion of the lead wire 112b.

The alloy ball bumps 118a, 118b are respectively connected to the alloy ball bumps 108a, 108b while using the high purity gold wires 110b, 110d by the wire bonding.

The end portion of the lead wire 112a is connected to the alloy ball bumps 108a, 108b while using the high purity gold wires 110a, 110c, by the wire bonding.

The semiconductor device 500 is sealed with the resin sealing body 114 except for the outer side end portion of the lead wires 112a, 112b in the FIG. 7.

According to this configuration, a process providing the alloy ball bumps 108a, 108b, 108c, and 108d composed of alloy formed in such a way as to add not less than one kind of metal selected from a group containing Pd, Ag, Cu, Fe, Mg, Be and Ca to the high purity gold, on the top face of the aluminum pads 106a, 106b, 106c and 106d is included, therefore, it is possible to form the connecting portion between the aluminum pads 106a, 106b, 106c and 106d and the alloy ball bumps 108a, 108b, 108c and 108d with deterioration of the contact property in long term use suppressed, so that it is possible to manufacture the semiconductor device 500 that is excellent in long-term reliability.

Further, a configuration provided with the alloy ball bumps 118a, 118b including the alloy formed in such a way as to add not less than one kind of metal selected from a group containing Pd, Ag, Cu, Fe, Mg, Be and Ca to the high purity gold, at the end portion of the lead wire 112b, therefore, the semiconductor device 500 has the connecting portion between the lead wire 112b and the alloy ball bumps 118a, 118b with deterioration of the contact property in long term use suppressed, so that it is possible to obtain the semiconductor device 500 that is excellent in long-term reliability.

Further, the wire bonding is performed using the high purity gold wires 110a, 110b, 110c and 110d that are excellent in bendability, therefore, it is possible to obtain the semiconductor device 500 that is excellent in manufacturing stability that is capable of easily performing the wire bonding that is excellent in contact property between the alloy ball bumps 108a, 108b, 108c, 108d, 118a and 118b and the high purity gold wires 110a, 110b, 110c and 110d.

Further, the configuration sealing the whole of the semiconductor device 500 is obtained by the resin sealing body 114 except for the outer side end portion of the lead wires 112a, 112b, therefore, it is possible to effectively suppress intrusion of the moisture. For this reason, deterioration of the contact property between the aluminum pads 106a, 106b, 106c and 106d and the alloy ball bumps 108a, 108b, 108c and 108d is suppressed in long term use, so that it is possible to obtain the semiconductor device 500 with high reliability. Further, deterioration of the contact property between the lead wire 112b and the alloy ball bumps 118a, 118b is suppressed, so that it is possible to obtain the semiconductor device 500 with high reliability. It should be noted that the semiconductor device 500 as shown in FIG. 7 can be manufactured by similar method as manufacturing method shown in FIGS. 2A, 2B and FIGS. 3C, 3D.

As above, there is described the embodiment of the present invention with reference to the drawings, however, these are illustrations of the present invention, so, it is possible to adopt various constitutions other than the above.

For instance, in the present embodiment, the configuration is that the semiconductor chips 104a, 104b are provided on the top face and under face of the island 102, however, it may be a configuration formed in such a way as to form the semiconductor chips 104a, 104b on the top face of the island 102. At this time, it may be that any of the semiconductor chips 104a, 104b are formed in the shape of face up. On the contrary, it may be that any of the semiconductor chips 104a, 104b are formed in the shape of face down. In such a way as above, the semiconductor chips 104a, 104b are capable of being easily bonded with a short path each other by the connection due to through electrode or face down bonding of the semiconductor chip 104b, for instance, so that an advantage that it is possible to achieve increasing signal transmitting speed is obtained.

EXAMPLES

Hereinafter, there will be further described the present invention based on examples, however, the present invention is not limited with these examples.

Experimental Example 1

A test sample (I) provided with the semiconductor chip bonded by the wire bonding to the substrate is formed, while performing the wire bonding with the high purity gold wire having not less than 99.99% purity to the alloy ball pad, after providing the alloy ball pad formed in such a way as to use the alloy wire containing gold 99 mass % and Pd 1 mass % on the aluminum pad.

Experimental Example 2

A test sample (II) provided with the semiconductor chip bonded by the wire bonding to the substrate is formed, while performing the wire bonding with the high purity gold wire having not less than 99.99% purity to the alloy ball pad, after providing the alloy ball pad formed in such a way as to use the alloy wire containing gold 99.8 mass % and Pd 0.2 mass % on the aluminum pad.

Experimental Example 3

A test sample (III) provided with the semiconductor chip bonded by the wire bonding to the substrate is formed, while performing the wire bonding with the high purity gold wire having not less than 99.99% purity to the gold ball pad, after providing the gold ball pad formed in such a way as to use the high purity gold wire having not less than 99.99% purity on the aluminum pad.

(Evaluated Result)

A stability acceleration test is performed, upon carrying out heating treatment of test samples (I) to (III) obtained in such a way as above under some temperature conditions such as 150° C., 175° C., 200° C. and the like. And then, test samples (I) to (III) are taken out temporarily at several different time points such as 168 hours, 500 hours, 1000 hours, 2000 hours, 3000 hours and the like, followed by observing cross section of bonding ball respective 20 pieces each, to ascertain whether or not there is occurrence of the Br corrosion or the Kirkendall void by the microscope.

The number of bonding balls with the Br corrosion or the Kirkendall void ascertained as the number of defect is plotted into logarithmic normal distribution, and the defect occurrence time L(10) is defined as follows:

L(10): it is defined as the time when the Br corrosion or the Kirkendall void occurs in the bonding ball of 10% within the whole bonding balls of the semiconductor chip in disregard of electrical characteristics.

Figure 12A:
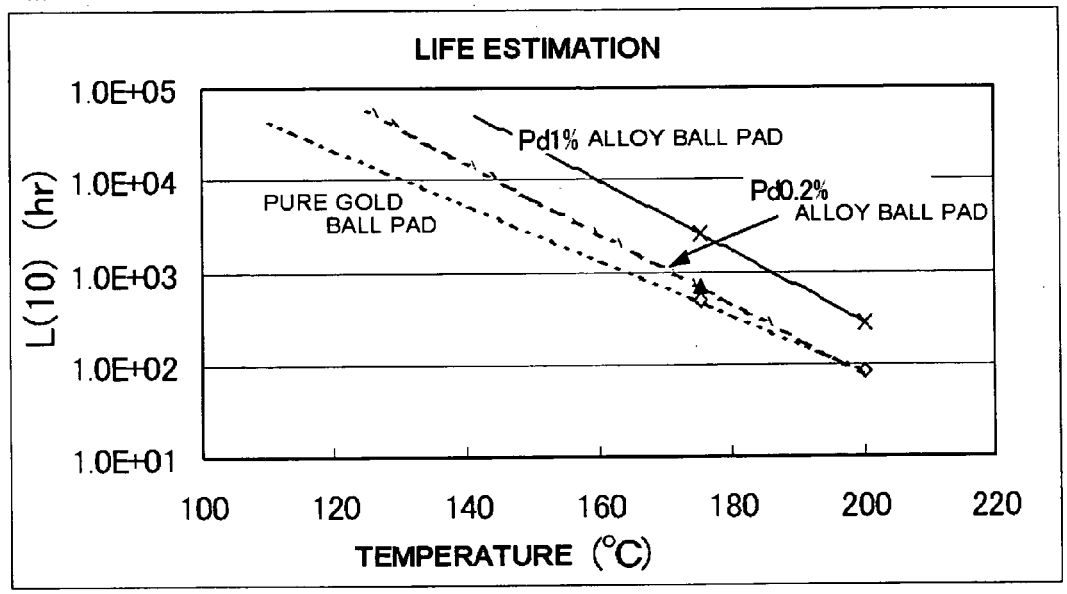
FIGS. 12A and 12B are graphical representations showing a result of comparison of stability of contact resistance of the wire bonding according to alloy ball bump with different material.
Figure 12B:
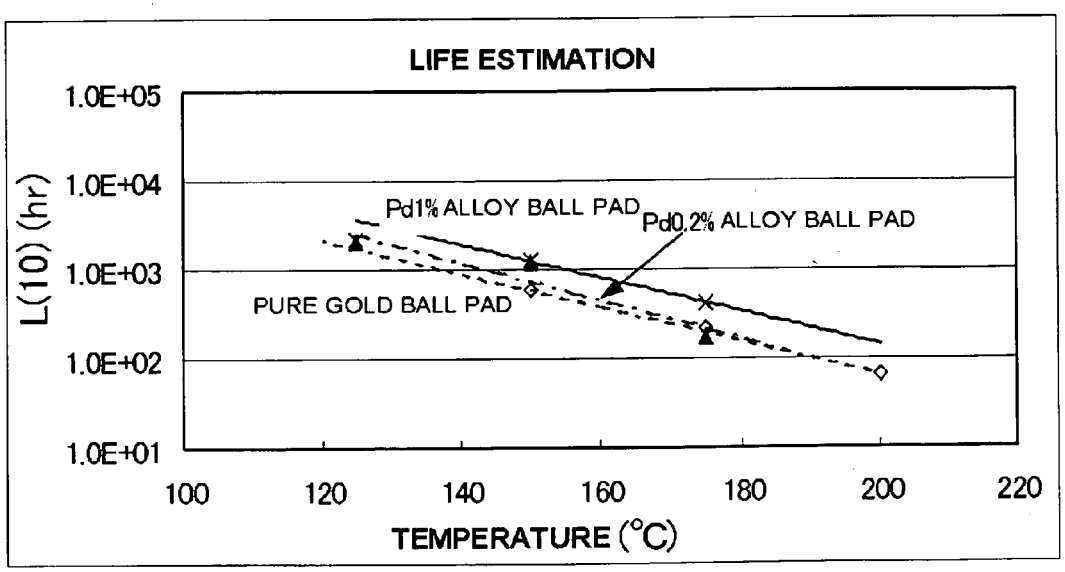

FIGS. 12A and 12B show the evaluated result of L(10) of the test samples (I) to (III) obtained in such a way as above.

FIGS. 12A and 12B are graphical representation showing a comparison result of the contact resistance stability of the wire bonding with the alloy ball bump with different materials.

Thus, the test sample (I) provided with the alloy ball bump containing Pd 1 mass % has larger value of L(10) to be an index to estimate a life of wire bonding portion of the semiconductor chip when compared to the test sample (III) provided with the gold ball bump made of the high purity gold.

Consequently, it is found that the semiconductor device provided with the alloy ball bump containing Pd 1 mass % is more excellent in long-term reliability than the semiconductor device provided with the gold ball bump composed of the high purity gold.

Further, the test sample (I) provided with the alloy ball bump containing Pd 1 mass % has larger value of L(10) to be an index to estimate the life of wire bonding portion of the semiconductor chip when compared to the test sample (II) provided with the alloy ball bump containing Pd 0.2 mass %.

Consequently, it is found that the semiconductor device provided with the alloy ball bump containing Pd 1 mass % is more excellent in long-term reliability than the semiconductor device provided with the alloy ball bump containing Pd 0.2 mass %.

As above, there is described the present invention based on the example. However, this example is only illustration, accordingly, various modified examples are possible, and those skilled in the art may understand that also such modified examples fall within the scope of the present invention.

For instance, in the above example, the alloy ball bump containing Pd 1 mass % is used as the alloy ball bump, however, it may contain a little amount of element other than Pd. For instance, it may be contain not less than one kind of metal selected from a group containing Ag, Cu, Fe, Mg, Be and Ca. In this case, an improvement effect of the alloy ball bump characteristics depending on each element characteristics is expected.

It is apparent that the present invention is not limited to the above embodiment, and that the above embodiment may be modified and changed without departing from the scope and sprit of the invention.

What is claimed is:

1. A semiconductor device comprising:
    a semiconductor element;
    an electrode pad formed on said semiconductor element;
    a metal bump formed on said electrode pad, and comprising an alloy including gold and palladium;
    a conductive wire having a gold surface which is bonded to said metal bump; and
    a second metal bump connected at an end portion of said conductive wire, and containing gold and palladium.

2. The semiconductor device according to claim 1, wherein said metal bump contains gold in a range of approximately 98 mass % to 99.5 mass %, and palladium in a range of approximately 0.5 mass % to 2 mass %.

3. The semiconductor device according to claim 1, wherein said electrode pad contains aluminum.

4. The semiconductor device according to claim 1, wherein said conductive wire comprises a gold wire.

5. The semiconductor device according to claim 1, wherein said conductive wire is a conductive wire on a Tape Automated Bonding (TAB) tape.

6. The semiconductor device according to claim 1, further comprising:
    a resin sealing body sealing said semiconductor element, said electrode pad, said metal bump and said conductive wire.

7. The semiconductor device according to claim 1, further comprising:
    a lead wire,
    wherein said second metal bump is formed on an end portion of said lead wire.

8. The semiconductor device according to claim 7, wherein said end portion of the lead wire contains aluminum.

9. The semiconductor device according to claim 7, wherein said resin sealing body seals said end portion of said lead wire and said second metal bump.

10. The semiconductor device according to claim 4, further comprising:
    a bond formed between said gold wire and said metal bump.

11. The semiconductor device according to claim 1, further comprising:
    a palladium rich region formed in a bonding region between said metal bump and said conductive wire.

12. The semiconductor device according to claim 11, wherein said palladium rich region suppresses a diffusion of gold in said metal bump across said bonding region.

13. A method for manufacturing a semiconductor device, comprising:
    forming an electrode pad on a semiconductor element;
    forming a metal bump comprising an alloy including gold and palladium on said electrode pad;
    bonding a conductive wire having a gold surface at a first end to said metal bump; and
    connecting said conductive wire at a second end to a second metal bump containing gold and palladium.

14. The method for manufacturing the semiconductor device according to claim 13, wherein said connecting said conductive wire includes performing wire bonding of a gold wire.

15. The method for manufacturing the semiconductor device according to claim 13, wherein said connecting said conductive wire includes performing TAB bonding of conductive wire on a Tape Automated Bonding (TAB) tape.

16. The method for manufacturing the semiconductor device according to claim 13, further comprising:
    sealing said semiconductor element, said electrode pad, said metal bump and said conductive wire with a resin sealing body.

17. The method for manufacturing the semiconductor device according to claim 13, further comprising:
    forming said second metal bump on an end portion of a lead wire.

18. The method for manufacturing the semiconductor device according to claim 16, wherein said sealing further seals said end portion of said lead wire and said second metal bump with said resin sealing body.

19. An electrical connection apparatus for a semiconductor device comprising:
- a metal bump comprising an alloy including gold and palladium;
- a conductive wire having a gold surface bonded at a first end to said metal bump; and
- a second metal bump comprising an alloy including gold and palladium bonded at a second end of said conductive wire.

20. The electrical connection apparatus of claim 19, wherein said first and second metal bumps contain gold in a range of approximately 98 mass % to 99.5 mass %, and palladium in a range of approximately 0.5 mass % to 2 mass %.

21. The electrical connection apparatus of claim 19, further comprises:
- an electrical connection containing aluminum,
- wherein at least one of said first and said second metal bumps is formed on said electrical connection.

22. The electrical connection apparatus of claim 21, wherein said electrical connection comprises one of an electrode pad formed on a semiconductor element and a lead wire.

23. The electrical connection apparatus of claim 19, wherein said conductive wire comprises one of a gold wire and a conductive wire on a Tape Automated Bonding (TAB) tape.

* * * * *